United States Patent [19]

DiViesti

[11] Patent Number: 5,230,638

[45] Date of Patent: Jul. 27, 1993

[54] SURFACE MOUNTED ELECTRICAL CONNECTOR FOR PRINTED CIRCUIT BOARDS

[75] Inventor: Anthony M. DiViesti, Arlington Heights, Ill.

[73] Assignee: Molex Incorporated, Lisle, Ill.

[21] Appl. No.: 929,087

[22] Filed: Aug. 12, 1992

[51] Int. Cl.⁵ .......................................... H01R 13/73
[52] U.S. Cl. .................................... 439/567; 439/571; 248/901
[58] Field of Search ............... 439/554, 557, 558, 567, 439/571; 248/220.3, 220.4, 901

[56] References Cited

U.S. PATENT DOCUMENTS 4,195,900 4/1980 Hughes .............................. 439/571
4,734,043 3/1988 Emert et al. ........................ 439/65

OTHER PUBLICATIONS

Molex Drawing No. SDA-8619-1200 Sheet No. 1.
Molex Drawing No. P-43027 Sheet No. 2.

Primary Examiner—Gary F. Paumen
Attorney, Agent, or Firm—Stacey E. Caldwell; Charles S. Cohen

[57] ABSTRACT

A mounting peg system is disclosed in an electrical connector adapted for surface mounting on a printed circuit board. The connector includes an elongated insulating housing defining a longitudinal direction and a transverse direction of the connector. At least a pair of mounting pegs are spaced longitudinally of the housing for mounting in a respective pair of mounting holes in the printed circuit board. The mounting peg system includes one of the pair of mounting pegs being configured to be relatively rigid in both the longitudinal and transverse directions of the connector to securely retain the connector on the circuit board. The other of the pair of mounting pegs is configured to be relatively rigid in the transverse direction and relatively compliant in the longitudinal direction to accommodate longitudinal thermal expansion of the housing relative to the circuit board.

11 Claims, 3 Drawing Sheets

SURFACE MOUNTED ELECTRICAL CONNECTOR FOR PRINTED CIRCUIT BOARDS

FIELD OF THE INVENTION

This invention generally relates to the art of electrical connectors and, particularly, to surface mounted printed circuit board connectors and, still further, to an improved mounting peg system for retaining a connector on a printed circuit board.

BACKGROUND OF THE INVENTION

Surface mounted printed circuit board connectors, particularly elongated connectors such as edge-card connectors or SIMM sockets, typically use mounting pegs or boardlocks to locate the connectors on a printed circuit board and to hold the surface mount leads of the connectors to the printed circuit board during soldering of the leads to the board circuit traces. If the connector is not properly held to the circuit board during soldering, the leads can move off of the surface of the board or become misaligned with the circuit traces or solder pads entirely. This would result in open circuit conditions and a defective connection between the connector and the board.

On the other hand, if the retention of the connector to the circuit board is not sufficiently compliant, particularly in elongated connectors, thermal expansion of the connector housing relative to the circuit board during soldering can cause bowing of the connector between two rigidly held areas, again resulting in the surface mount leads not making contact with the circuit traces or solder pads on the board.

Still further, surface mount connector applications often use double-sided circuit boards on which components, including the connectors, are mounted on each side of the board. This requires subjecting each side of the board to a solder reflow process, resulting in the connectors on the underside of the board traveling upside down during heating of the upper surface. The mounting pegs therefore must hold the connector to the board in such conditions so that the leads remain in contact with the circuit board traces. Furthermore, the mounting pegs cannot protrude through the board to the opposite side of the board where they may interfere with other components. Consequently, mounting pegs having protruding boardlocks or hook portions simply cannot be used.

There is a need for an improved mounting peg system for surface mounted printed circuit board connectors having sufficient retention force to hold the connectors on the circuit board during soldering, yet providing sufficient compliance to accommodate thermal expansion of the connectors relative to the circuit board, while maintaining the mounting pegs within the plane of the printed circuit board. This invention is directed to satisfying this need and solving the problems outlined above.

SUMMARY OF THE INVENTION

An object, therefore, of the invention is to provide a new and improved mounting peg system for a surface mounted printed circuit board electrical connector.

In the exemplary embodiment of the invention, an electrical connector is disclosed as adapted for surface mounting on a printed circuit board. The connector includes an elongated insulating housing defining a longitudinal direction and a transverse direction of the connector. At least a pair of mounting pegs are spaced longitudinally of the housing for mounting in a respective pair of mounting holes in the printed circuit board.

The invention contemplates that one of the pair of mounting pegs is configured to be relatively rigid in both the longitudinal and transverse directions of the connector to securely retain the connector on the circuit board, as during soldering processes. The other of the pair of mounting pegs is configured to be relatively rigid in the transverse direction and relatively compliant in the longitudinal direction to accommodate longitudinal thermal expansion of the connector housing.

As disclosed herein, the one mounting peg which is rigid in both the longitudinal and transverse directions is located generally centrally of the longitudinal connector housing. One of the other of the mounting pegs which is relatively rigid in the transverse direction but relatively compliant in the longitudinal direction is located near each opposite end of the elongated connector. The longitudinally compliant mounting peg is shown as being of a generally V-shape in cross-section in a direction transversely of the connector.

Preferably, the mounting pegs have lengths not to exceed the thickness of the printed circuit board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
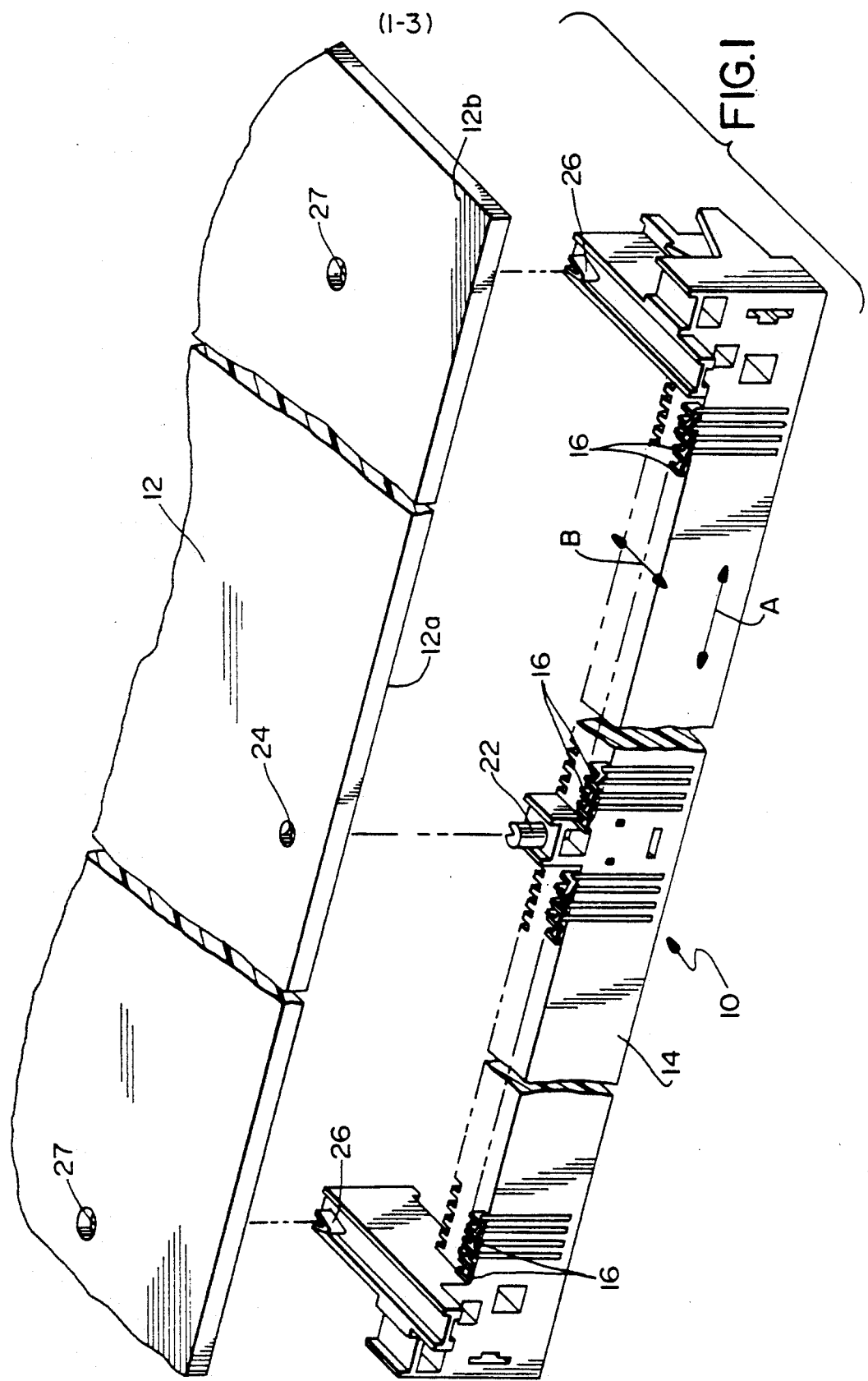
FIG. 1 is a perspective view of an elongated electrical connector incorporating the mounting peg system of the invention, in conjunction with a printed circuit board to which the connector is surface mounted.

Referring to the drawings in greater detail and first to FIG. 1, the mounting peg system of the invention is incorporated in an elongated electrical connector, generally designated 10, adapted for surface mounting on a printed circuit board 12. The connector may be of a variety of configurations or types, such as an edge-card connector for interconnecting a second printed circuit board to circuit board 12, such as a commonly known "SIMM socket". In such instances, circuit board 12 is called the mother board and the second circuit board is called the daughter board. Of course, the invention is equally applicable for other configurations of elongated surface mounted connectors, such as headers or the like.

Therefore, extraneous details of elongated connector 10 will not be described herein. Suffice it to say, connector 10 includes an elongated dielectric or insulating housing 14 defining a longitudinal direction, as indicated by double-headed arrow "A" (FIG. 1) and a transverse direction as indicated by double-headed arrow "B". In other words, longitudinal direction "A" defines the long dimension of the connector and arrow "B" defines the short dimension of the connector.

A plurality of terminals are mounted in housing 14 and include a plurality of surface mount leads or solder feet 16 exposed exteriorly of housing 14 as shown in FIG. 1. These leads are intended to be surface mounted to circuit traces or solder pads on one side of printed circuit board 12, the underside 12a as viewed in FIG. 1.

Figure 2:
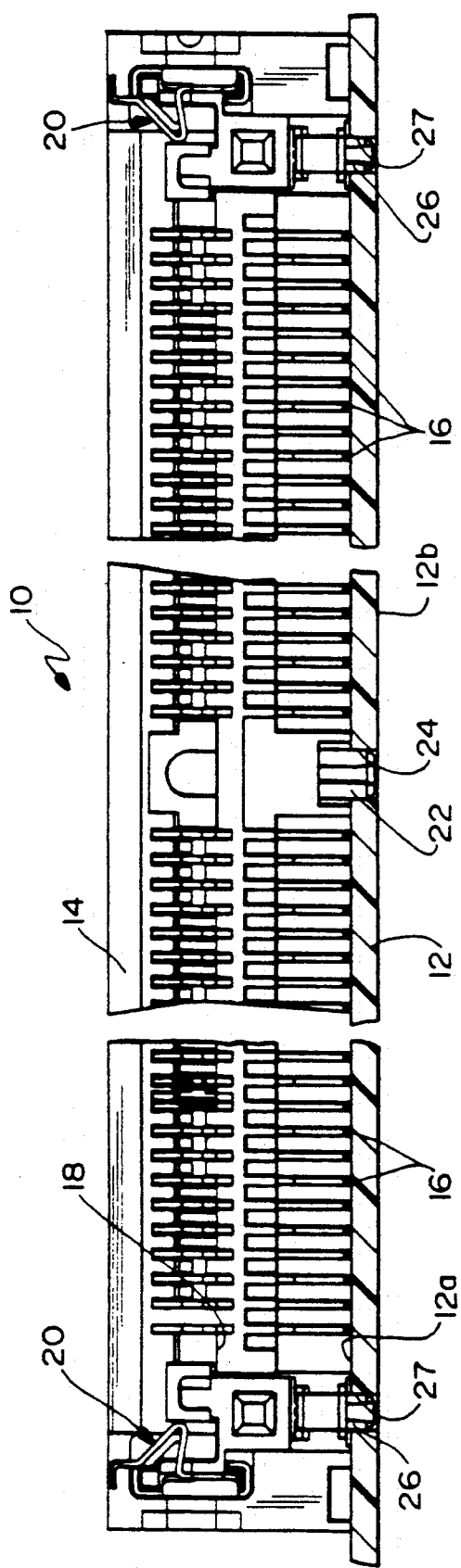
FIG. 2 is a section through the printed circuit board, with the elongated connector surface mounted thereto.

FIG. 2 shows connector 10 surface mounted to circuit board 12, with surface mount leads 16 in engagement with side 12a of the board whereat the leads are soldered to circuit traces on that side of the board. FIG. 2 also shows that connector housing 14 has a slot 18 running substantially the length of the housing for receiving the second or daughter printed circuit board. In other words, connector 10 is configured as an edge-card connector. Latch means, generally designated 20, are provided at opposite ends of the connector for latching the daughter board within the slot in termination with the terminals of the connector.

As stated in the "Background", above, problems are encountered in retaining elongated connectors, such as connector 10, to a printed circuit board, such as circuit board 12, during a soldering operation such as soldering leads 16 to solder pads on side 12a of the circuit board. On the one hand, it is desirable to rigidly maintain the position of the connector relative to the circuit board, particularly connector housing 14, so that the surface mount leads do not move from their aligned positions with their respective solder pads on the circuit board. On the other hand, if the retention of the connector to the board is not sufficiently compliant, thermal expansion of the connector relative to the circuit board, particularly elongated dielectric housing 14, can cause bowing of the connector between two tightly held areas, again resulting in the surface mount leads not making contact with the traces on the board. In addition, in many surface mount applications, other components, including other connectors, may be surface mounted to side 12b of the circuit board. In such applications, the mounting pegs or other boardlocks cannot project beyond the plane of the circuit board, i.e. beyond side 12b of the board.

In order to solve these problems, the invention contemplates the use of a plurality of differently configured mounting pegs which are effective to tightly hold the connector to the printed circuit board and still be sufficiently compliant to accommodate thermal expansion of the connector relative to the printed circuit board, particularly the elongated dielectric housing. More particularly, the mounting peg system of the invention includes a mounting peg 22 which, generally, is configured to be relatively rigid in both the longitudinal direction ("A") as well as the transverse direction ("B") of the connector to securely retain the connector on circuit board 12. Mounting peg 22 fits tightly within a circular hole 24 of circuit board 12. The mounting peg system of the invention further includes at least one other mounting peg 26 which, generally, is configured to be relatively rigid in the transverse direction ("B") and relatively compliant in the longitudinal direction ("A") of the connector, to accommodate longitudinal thermal expansion of the connector relative to the circuit board, particularly thermal expansion of the elongated dielectric housing 14. Mounting peg 26 fits within a circular hole 27 in circuit board 12. With such a system, the connector is retained to the circuit board between at least two longitudinally spaced locations defined by the mounting pegs, one of the pegs rigidly holding the connector to the board and the other peg transversely holding the connector while allowing longitudinal expansion.

In the connector application disclosed in the drawings, connector 10 and housing 14 are rather long, i.e. in longitudinal direction "A". Therefore, the embodiment of the invention herein utilizes one mounting peg 22 located generally centrally of the longitudinal housing and two mounting pegs 26 located near the two opposite ends of the housing. Therefore, all three pegs hold the connector relatively rigidly to printed circuit board 12 in the transverse or short dimension of connector housing 14. Thermal expansion of the housing in this short direction is less significant. However, while center mounting peg 22 properly locates and holds the connector to printed circuit board 12 in the longitudinal direction of the connector, end mounting pegs 26, being compliant in the longitudinal direction, accommodates thermal expansion of the housing relative to the circuit board in both longitudinal directions away from center peg 22.

Figure 3:
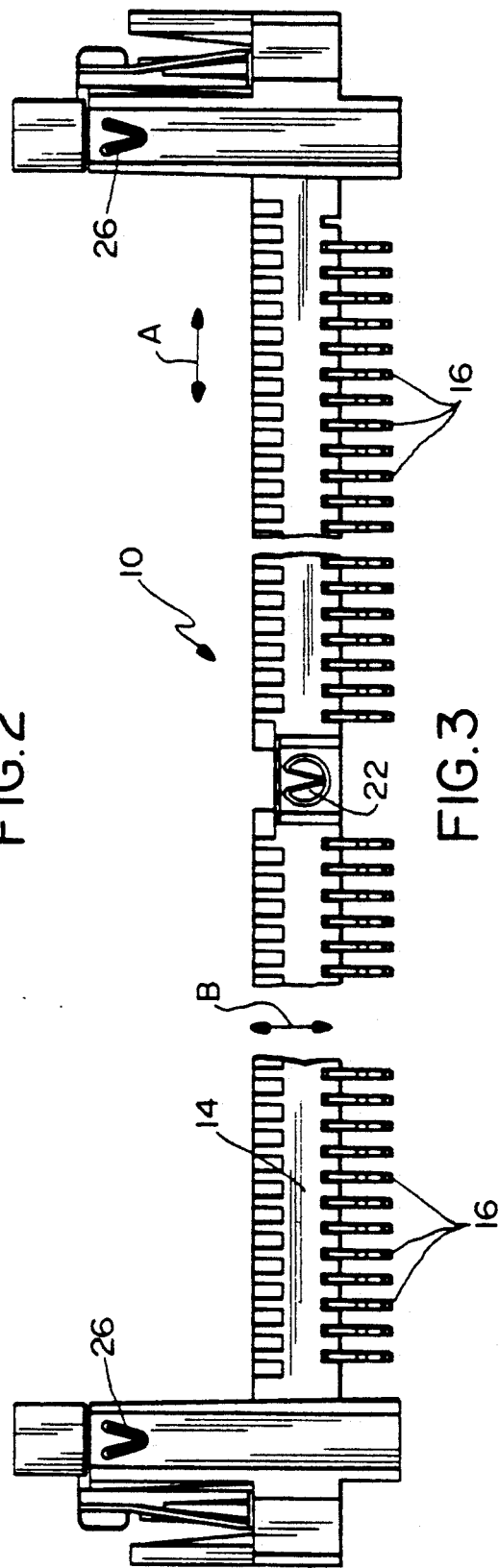
FIG. 3 is a top plan view of the connector as viewed in FIG. 1, a bottom plan view as viewed in FIG. 2.
Figure 4:
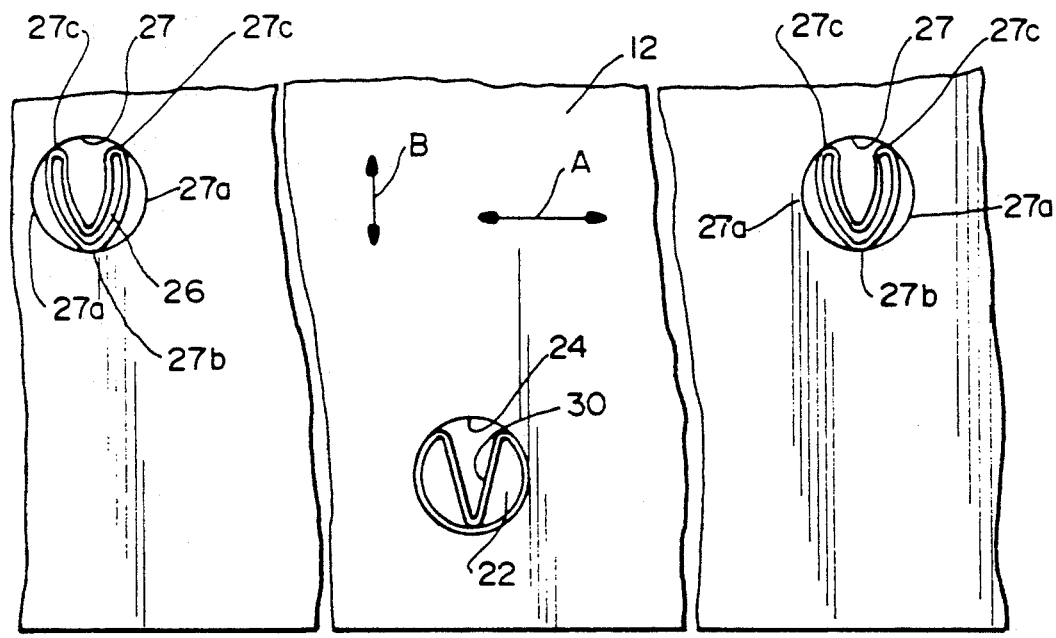
FIG. 4 is a fragmented plan view of isolated portions of the printed circuit board, to illustrate the configurations of the mounting pegs in conjunction with their respective mounting holes in the board.

Referring to FIG. 4 in conjunction with FIGS. 1-3, center mounting peg 22 and end mounting pegs 26 are shown adjacent each other in an isolated depiction to illustrate configurations of the mounting pegs in conjunction with the respective holes 24 and 27 in circuit board 12. More particularly, it can be seen that center mounting peg 22 is generally cylindrical in cross-section and engages a substantial area of the inner periphery of mounting hole 24. The peg is split, as at 30, to enable the peg to be tightly press-fit into its respective mounting hole. This configuration of mounting peg 22 affords a relatively rigid mount of the connector to the circuit board in both the longitudinal direction "A" as well as the transverse direction "B" of the connector.

On the other hand, still referring to FIG. 4, each end mounting peg 26 is generally V-shaped in cross-section so that the mounting peg is spaced from the sides of its respective mounting hole 27 at points 27a, while the apex of the V-shape engages the hole perimeter at point 27b and the distal ends of the legs of the V-shape engage the periphery of the mounting hole at points 27c. In other words, the V-shape of the mounting pegs is oriented generally transversely of the connector. Although slightly exaggerated for illustration purposes, it can be seen in FIG. 4 how the legs of the V-shaped pegs are bowed outwardly as the pegs are press fit into holes 27, but the legs still do not engage the sides of the holes at points 27a. This allows for compliance in the longitudinal direction of the connector. Although other configurations of mounting pegs are contemplated by the invention, the V-shaped mounting pegs afford relatively rigid mounting of the connector in the transverse direction "B" of the connector, at engaging points 27b and 27c, while affording compliance between the pegs and the printed circuit board, as by the spacing at points 27a.

Figure 5:
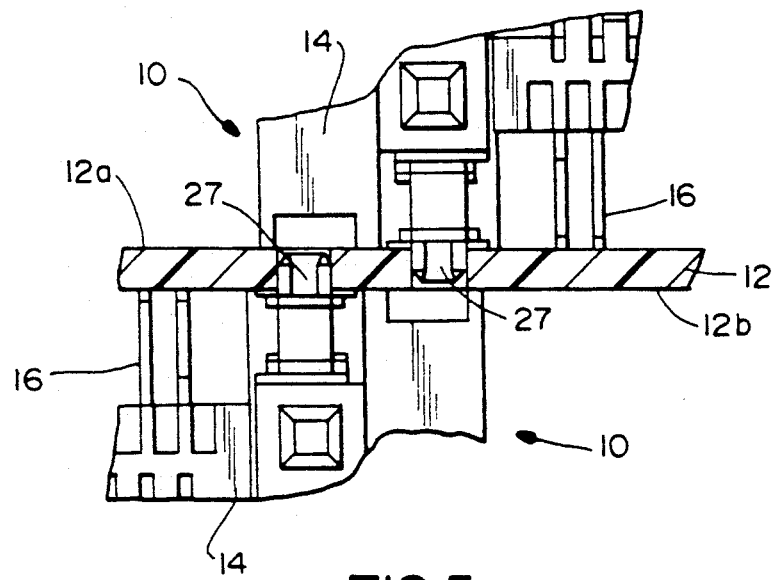
FIG. 5 is a fragmented view of a pair of connectors mounted on both sides of a printed circuit board.

FIG. 5 illustrates a dilemma in mounting peg systems wherein components, such as a pair of connectors 10, are mounted on opposite sides of printed circuit board 12. In such applications, the mounting peg or pegs of a connector cannot protrude beyond the "opposite" side of the printed circuit board where the protruding portions of the mounting peg might interfere with other components, such as other connectors, on double-sided mounted boards. Therefore, it can be seen that mounting pegs 26 have lengths not to exceed the thickness of the circuit board. This also would be true of the length of center mounting peg 22.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an electrical connector adapted for surface mounting on a printed circuit board, including
    an elongated insulating housing defining a longitudinal direction and a transverse direction of the connector, and
    at least a pair of mounting pegs spaced longitudinally along the housing for mounting in a respective pair of mounting holes in the circuit board,
    wherein the improvement comprises:
    one of said pair of mounting pegs being configured to be relatively rigid in both the longitudinal and transverse directions of the connector to securely retain the connector on the circuit board, and the other of said pair of mounting pegs being configured to be relatively rigid in said transverse direction and relatively compliant in said longitudinal direction to accommodate longitudinal thermal expansion of the housing relative to the circuit board.

2. In an electrical connector as set forth in claim 1, wherein said other of the pair of mounting pegs is generally V-shaped in cross-section in a direction transversely of the connector.

3. In an electrical connector as set forth in claim 1, wherein said other of the pair of mounting pegs is located near one end of the housing, and the one mounting peg is spaced longitudinally inwardly therefrom.

4. In an electrical connector as set forth in claim 1, wherein said mounting pegs have lengths not to exceed the thickness of the circuit board.

5. In an electrical connector as set forth in claim 1, wherein said one of the pair of mounting pegs is generally cylindrical in cross-section.

6. In an electrical connector as set forth in claim 5, wherein said one of the pair of mounting pegs is at least partially axially split.

7. In an electrical connector adapted for surface mounting on a printed circuit board, including
    an elongated insulating housing defining a longitudinal direction and a transverse direction of the connector, and
    a plurality of mounting pegs spaced longitudinally along the housing for mounting in a plurality of respective mounting holes in the circuit board,
    wherein the improvement comprises:
    one of said mounting pegs being located intermediate opposite ends of the connector and being configured to be relatively rigid in both the longitudinal and transverse directions of the connector to securely retain the connector on the circuit board, and another of the mounting pegs being located near each opposite end of the connector and being configured to be relatively rigid in said transverse direction and relatively compliant in said longitudinal direction to accommodate longitudinal thermal expansion of the housing relative to the circuit board.

8. In an electrical connector as set forth in claim 7, wherein said another of the mounting pegs each is generally V-shaped in cross-section in a direction transversely of the connector.

9. In an electrical connector as set forth in claim 8, wherein said one of the pair of mounting pegs is generally cylindrical in cross-section.

10. In an electrical connector as set forth in claim 9, wherein said one of the pair of mounting pegs is at least partially axially split.

11. In an electrical connector as set forth in claim 7, wherein said mounting pegs have lengths not to exceed the thickness of the circuit board.

* * * * *